US008431418B2

(12) United States Patent
Choi

(10) Patent No.: US 8,431,418 B2
(45) Date of Patent: Apr. 30, 2013

(54) METHOD OF MANUFACTURING MAGNETIC TUNNEL JUNCTION DEVICE AND APPARATUS FOR MANUFACTURING THE SAME

(75) Inventor: Young-suk Choi, Santa Clara, CA (US)

(73) Assignee: Canon Anelva Corporation, Kanagawa-Ken (JP)

( * ) Notice: Subject to any disclaimer, the term of this patent is extended or adjusted under 35 U.S.C. 154(b) by 289 days.

(21) Appl. No.: 12/872,373

(22) Filed: Aug. 31, 2010

(65) Prior Publication Data

US 2011/0081732 A1    Apr. 7, 2011

Related U.S. Application Data

(63) Continuation of application No. PCT/JP2009/053966, filed on Mar. 3, 2009.

(30) Foreign Application Priority Data

Mar. 3, 2008   (JP) .................................. 2008-052558

(51) Int. Cl.
*H01L 21/00* (2006.01)
(52) U.S. Cl.
USPC ...................................... 438/3; 257/E21.665
(58) Field of Classification Search ...................... 438/3; 257/E21.665
See application file for complete search history.

(56) References Cited

U.S. PATENT DOCUMENTS

| 6,710,987 | B2 | 3/2004 | Sun et al. |
| 6,974,708 | B2 | 12/2005 | Horng et al. |
| 7,479,394 | B2 * | 1/2009 | Horng et al. ...................... 438/3 |
| 7,602,033 | B2 * | 10/2009 | Zhao et al. ..................... 257/427 |
| 7,790,626 | B2 | 9/2010 | Ikeda et al. |
| 2002/0064595 | A1 | 5/2002 | Nomura et al. |
| 2002/0097534 | A1 | 7/2002 | Sun et al. |
| 2003/0008416 | A1 | 1/2003 | Shimura et al. |
| 2007/0111332 | A1 | 5/2007 | Zhao et al. |
| 2007/0148786 | A1 | 6/2007 | Horng et al. |
| 2007/0195592 | A1 | 8/2007 | Yuasa |

(Continued)

FOREIGN PATENT DOCUMENTS

| CN | 101044258 A | 10/2005 |
| JP | 2000-036628 A | 2/2000 |

(Continued)

OTHER PUBLICATIONS

J.S. Moodera et al., "Large Magnetoresistance at Room Temperature in Ferromagnetic Thin Film Tunnel Junctions," Physical Review Letters, Apr. 17, 1995, pp. 3273-3276, vol. 74, No. 16, The American Physical Society.

(Continued)

*Primary Examiner* — William D Coleman

(74) *Attorney, Agent, or Firm* — Buchanan Ingersoll & Rooney PC

(57) ABSTRACT

A method of manufacturing a magnetic tunnel junction device includes a barrier layer forming step of forming a tunnel barrier layer. The barrier layer forming step comprises a step of depositing a first metal layer, an oxygen surfactant layer forming step of forming an oxygen surfactant layer on the first metal layer, a step of deposing a second metal layer above the first oxygen surfactant layer, and an oxidation step of oxidizing the first metal layer and the second metal layer to form a metal oxide layer.

10 Claims, 12 Drawing Sheets

U.S. PATENT DOCUMENTS

| | | |
|---|---|---|
| 2007/0253118 A1 | 11/2007 | Hayakawa et al. |
| 2007/0264728 A1 | 11/2007 | Miura et al. |
| 2008/0026253 A1 | 1/2008 | Yuasa et al. |

FOREIGN PATENT DOCUMENTS

| | | |
|---|---|---|
| JP | 2002-232040 | 8/2002 |
| JP | 2002-314166 | 10/2002 |
| JP | 2006-058748 A | 3/2006 |
| JP | 2007-142424 A | 6/2007 |
| JP | 2007-294737 A | 11/2007 |
| JP | 2007-305771 A | 11/2007 |
| JP | 2008-034523 A | 2/2008 |
| JP | 2008-052558 A | 3/2008 |
| WO | WO 2005/088745 A1 | 9/2005 |
| WO | WO 2006/006630 A1 | 1/2006 |

OTHER PUBLICATIONS

W.H. Butler et al., "Spin-dependent tunneling conductance of Fe/MgO/Fe sandwiches," Physical Review B, 2001, pp. 054416-1-054416-12, vol. 63, The American Physical Society.

Shinji Yuasa et al., "Giant room-temperature magnetoresistance in single-crystal Fe/MgO/Fe magnetic tunnel junctions," Nature Materials, Dec. 2004, pp. 868-871, vol. 3, Nature Publishing Group.

Stuart S.P. Parkin et al., "Giant tunnelling magnetoresistance at room temperature with MgO (100) tunnel barriers," Nature Materials, Dec. 2004, pp. 862-867, vol. 3, Nature Publishing Group.

David D. Djayaprawira et al., "230% room-temperature magnetoresistance in CoFeB/MgO/CoFeB magnetic tunnel junctions," Applied Physics Letters, 2005, pp. 1-3, vol. 86, 092502, American Institute of Physics.

Byongguk Park et al., "A study on tunneling magnetoresistance in magnetic tunnel junctions oxidized by ozone," Journal of Magnetism and Magnetic Materials, 2001, pp. 926-929, vol. 226-230, Elsevier Science B.V.

S.C. Oh et al., "Magnetic and Electrical Properties of Magnetic Tunnel Junctions With Radical Oxidized MgO Barriers," IEEE Transactions on Magnetics, Oct. 2006, pp. 2642-2644, vol. 42, No. 10, IEEE.

Satoru Yoshimura et al., "Oxidation process of Mg films by using high-concentration ozone for magnetic tunnel junctions," Journal of Magnetism and Magnetic Materials, 2007, pp. 176-180, vol. 312, Elsevier B.V.

Saied Tehrani et al., "Magnetoresistive Random Access Memory Using Magnetic Tunnel Junctions," Proceedings of the IEEE, May 2003, pp. 703-714, vol. 19, No. 5, IEEE.

N.F. Mott, "A Theory of the Formation of Protective Oxide Films on Metals," Trans. Faraday Soc., 1939, pp. 1175-1177, vol. 35.

N. Cabrera, "On the Oxidation of Metals at Low Temperatures and the Influence of Light," Phil. Magaz., 1949, p. 175-189, vol. 40.

D. Starodub et al., "The reaction of $O_2$ with Al(110): a medium energy ion scattering study of nano-scale oxidation," Surface Science, 2004, pp. 199-214, vol. 552, Elsevier B.V.

David M. Wood, "Classical Size Dependence of the Work Function of Small Metallic Spheres," Physical Review Letters, Mar. 16, 1981, p. 749, vol. 46, No. 11.

Jun Soo Bae et al., "Study of the effect of natural oxidation and thermal annealing on microstructures of $AlO_x$ in the magnetic tunnel junction by high-resolution transmission electron microscopy," Applied Physics Letters, Feb. 18, 2001, pp. 1168-1170, vol. 80, No. 7, American Institute of Physics.

International Search Report (PCT/ISA/210) issued on Jun. 1, 2009, for International Application No. PCT/JP2009/053966.

Written Opinion (PCT/ISA/237) issued on Jun. 1, 2009, by Japanese Patent Office as the International Searching Authority for International Application No. PCT/JP2009/053966.

Written Opinion of the International Preliminary Examining Authority (PCT/IPEA/408) issued on Apr. 13, 2010, for International Application No. PCT/JP2009/053966.

Chinese Office Action issued in corresponding Chinese Patent Application No. 200980107496.X, dated Aug. 27, 2012, and English translation thereof.

Office Action issued in corresponding Japanese Patent Application No. 2010-501916, issued Feb. 1, 2013, and English translation thereof.

\* cited by examiner

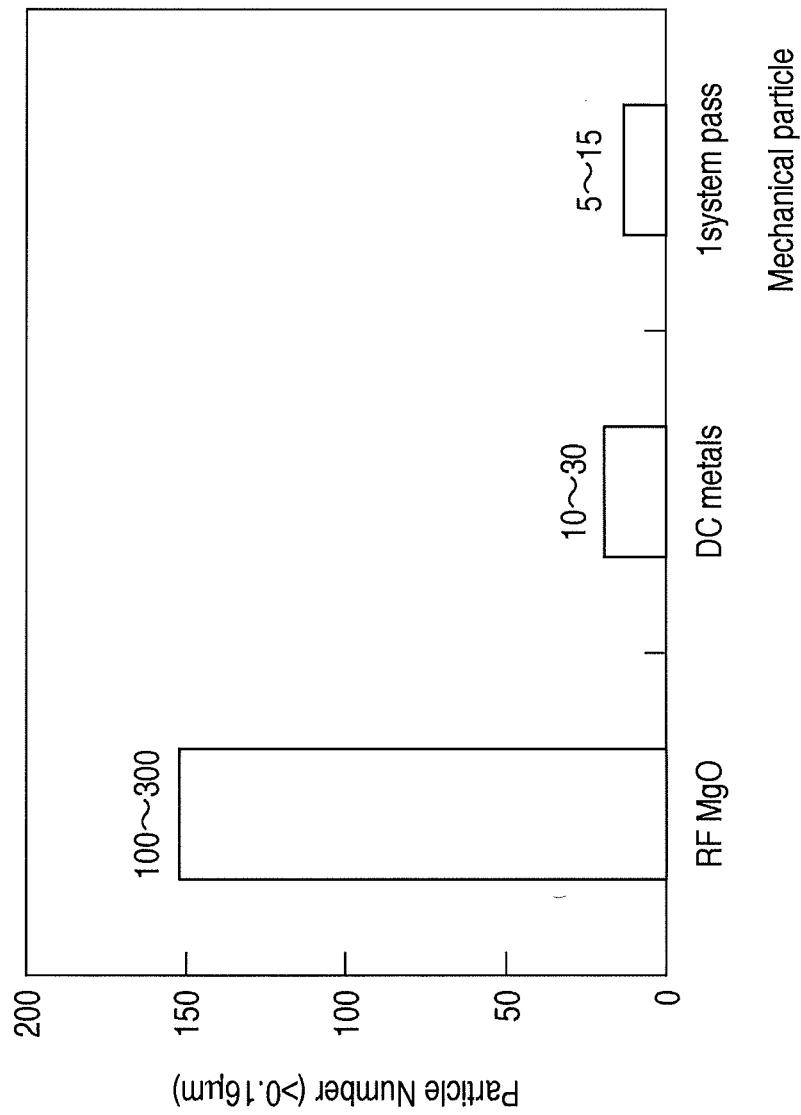

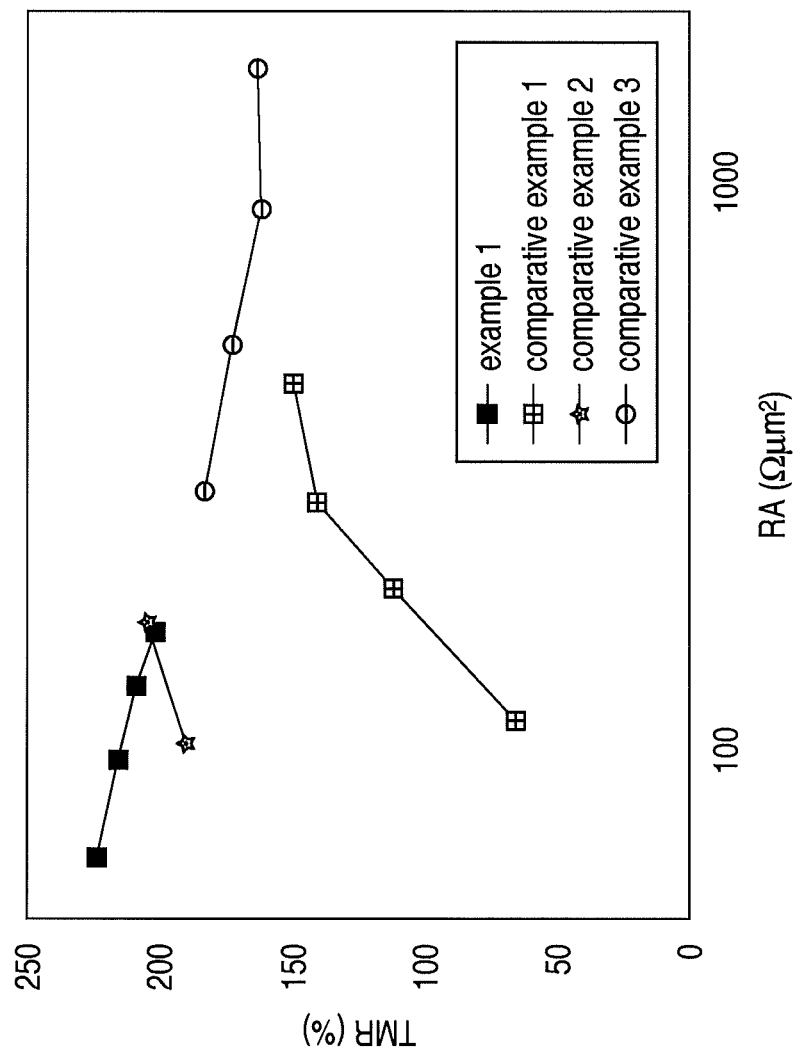

METHOD OF MANUFACTURING MAGNETIC TUNNEL JUNCTION DEVICE AND APPARATUS FOR MANUFACTURING THE SAME

TECHNICAL FIELD

This application claims priority as a continuation application under 35 U.S.C. §120 to PCT/JP2009/053966, which was filed as an International Application on Mar. 3, 2009, designating the U.S., and which claims priority to Japanese Application 2008-052558, filed in Japan on Mar. 3, 2008. The entire contents of these applications are hereby incorporated by reference in their entireties.

The present invention relates to a magnetic tunnel junction (MTJ) device and, more particularly, to a MTJ device applicable to a magnetic read head, magnetic random access memory (MRAM), and the like.

BACKGROUND ART

A magnetic tunnel junction (MTJ) device is basically a variable resistor including two ferromagnetic layers and a tunnel barrier sandwiched between them. The relative magnetization orientation of the two ferromagnetic layers causes electrons to pass through the tunnel barrier and make the spin-polarized electrons have different tunnel probabilities, thereby changing the resistance.

The tunnel barrier is generally made of an insulating material and must be very thin and have uniform thickness and structure. Nonuniformity of the tunnel barrier in chemical composition and thickness greatly degrades the device performance.

From the advent of MTJ devices, the development of MTJ devices having high TMR ratios at room temperature has been industrially a host issue in order to implement spintronic applications such as a nonvolatile magnetic random access memory and a hard disk read head having a surface density exceeding 100 Gbits/in$^2$ (Moodera et al., Phys. Rev. Lett., 74 (1995), p 3273).

During the initial period, high TMR ratios are achieved by a ferromagnetic electrode layer with a high spin polarization and an amorphous AlO$_x$ tunnel barrier. The highest TMR ratio of this arrangement at room temperature was about 70%. Thereafter, a spin filtering effect using a single-crystal MgO tunnel barrier having an NaCl structure was proposed by theoretical calculations (Butler et al., Phys. Rev., B63 (2001), p 054416). It was expected that a TMR ratio as high as 6,000% at room temperature was achieved.

The crystal structure of single-crystal MgO has a four-time symmetry. The state of electrons having a tunneling probability enough to pass through MgO is the Δ1 state having a four-time symmetry. For this reason, in a MTJ having a single-crystal Fe/MgO/Fe structure, conduction by the Δ1 band is dominant. However, since the Δ1 band in Fe is 100% spin-polarized at the Fermi level, a sufficient tunneling probability cannot be obtained in the antiparallel magnetization of the MTJ. That is, MgO has an effect of spin filtering depending on the magnetization state.

This allows coherent tunneling and can provide a higher TMR ratio. To achieve this higher TMR ratio, an experiment was conducted to grow single-crystal Fe/MgO/Fe by molecular beam epitaxy. This experiment exhibited a TMR ratio of 180% at room temperature (Yuasa et al., Nature materials, 3 (2004)).

A TMR ratio of 220% at room temperature was reported for a combination of a polycrystalline CoFe ferromagnetic electrode and an MgO tunnel barrier (Parkin et al., Nat. Mater., 3 (2004), p 862) A higher TMR ratio was reported in a MTJ having a combination of amorphous CoFeB and an MgO tunnel barrier on a silicon substrate having a thermal oxide in accordance with a magnetron sputtering method serving as a practical deposition method (Djayaprawira et al., Appl. Phys. Lett., 86 (2005), p 092502).

Many efforts have been made to form a MTJ tunnel barrier which is very thin and has uniform thickness and composition. An important point in the manufacture of an oxide tunnel barrier is to prevent surface oxidation of a ferromagnetic electrode layer serving as an underlayer of the tunnel barrier and prevent nonuniformity of an oxygen profile in the oxide tunnel barrier.

Tunnel barrier deposition methods are generally classified into a method of directly depositing an oxide and a method of depositing a metal and then oxidizing the metal. Examples of the direct deposition method are RF-sputtering using an oxide target and reactive sputtering for sputtering a metal target in an oxygen atmosphere. Examples of the method of depositing a metal and then oxidizing the metal are native oxidation, plasma oxidation, radical oxidation, and ozone oxidation.

SUMMARY OF INVENTION

Technical Problem

It is difficult to manufacture a MTJ device having a sufficiently high TMR ratio at room temperature and an R×A product falling within a range allowed as a spintronic application. This is due to the following reason. A spin transfer torque MRAM application must have an R×A product of less than 50 Ωμm$^2$ and a TMR ratio of more than 150%. A hard disk read head having a surface density of about 250 Gbits/in$^2$ must have an R×A product of 2 Ωμm$^2$ or less and a TMR ratio of more than 30% at room temperature.

One of the important problems in MTJ development is to uniformly control a tunnel barrier to a very small thickness. When the tunnel barrier becomes very thin, an electrical pinhole may be formed, thus generating a leak current not contributing to spin-dependent tunneling. This greatly degrades the signal-to-noise ratio (S/N).

Another problem is posed by over-oxidation or under-oxidation and a stoichiometric deviation of a tunnel barrier material by an underlying ferromagnetic electrode layer. By spin scattering at the surface-oxidized underlying ferromagnetic layer, these troubles bring about the same effect as in an increase in tunnel barrier thickness. This results in nonuniformity of electrical characteristics with respect to an applied voltage, an abnormal increase in R×A product, or a decrease in TMR ratio (Park et al., J. Magn. Magn. Mat. 226-230 (2001) p926). FIG. 2 is schematics of various oxidation states of tunnel barrier. "RL" in FIG. 2 indicates a ferromagnetic reference layer formed under the tunnel barrier, and "FL" indicates a ferromagnetic free layer formed on the tunnel barrier.

According to a recent finding (Japanese Patent Application No. 2006-058748), like a MTJ having MgO, when a tunnel barrier is directly deposited from a sintered oxide target by RF-sputtering, satisfactory RAs for all spintronic applications can be obtained with very high TMR ratios without any pinholes. RF-sputtering, however, has a difficult problem, for mass production, such as variations in MR values and RAs depending on the state of a chamber or generation of particles (Oh et al., IEEE Trans. Magn., 42 (2006), p 2642). According to another report, the final R×A product uniformity (1σ) of a MTJ device having an MgO tunnel barrier formed by RF-sputtering is 10% or more. To the contrary, the R×A product uniformity (1σ) of a MTJ device having an MgO tunnel barrier formed by oxidation after Mg deposition is less than 3% (U.S. Pre-Grant Publication No. 2007/0111332).

A method of plasma-oxidizing a metal after its deposition is very popular to manufacture a MTJ device having an $AlO_x$ tunnel barrier. Since plasma oxidation is highly reactive, it is difficult to oxide only a very thin metal layer. In particular, the oxidation rate of Mg in forming MgO is very high, and Mg is completely oxidized up to the interface of the underlying ferromagnetic layer. The oxidation of the underlying ferromagnetic layer results in the same TMR ratio as that in ozone oxidation, but a great increase in R×A product compared with ozone oxidation. The R×A product and TMR ratio in plasma oxidation in a MTJ having an Alo x tunnel barrier are 10,000 $\Omega\mu m^2$ and 45%, respectively (Tehrani et al., IEEE Trans. Magn., 91 (2003) p 703). The R×A product and TMR ratio in ozone oxidation are 1,000 $\Omega\mu m^2$ and 30%, respectively (Park et al., J. Magn. Magn. Mat., 226-230 (2001), p. 926).

Low-energy oxidation processes such as radical oxidation and ozone oxidation are proposed as a method of forming an MgO tunnel barrier, and the R×A product and TMR ratio obtained by radical-oxidizing 8-Å Mg are 230 $\Omega\mu m^2$ and 90%, respectively. The R×A product and TMR ratio obtained by ozone-oxidizing 13-Å Mg are 1,000 $\Omega\mu m^2$ and 10% (Oh at al., IEEE Trans. Magn., 42 (2006) P. 2642 and Yoshimura et al., J. Magn. Magn. Mat., 312 (2007) p 176). A spin transfer torque MRAM product must have an R×A product of less than 50 $\Omega\mu m^2$ and a TMR ratio exceeding 150%. To apply the above oxidation techniques, the TMR ratios are too low, and the RAs are too large. This indicates that radical oxidation and ozone oxidation for Mg cannot control oxidation of Mg to form an MgO tunnel barrier to a sufficiently low energy and a lower oxidation rate. Low-energy oxidation can be performed by native oxidation. However, the resistance of junction is very low. This is because nonuniform oxidation results in a nonuniform current in a junction area (Park et al., J. Magn. Magn. Mat., 226-230 (2001) p 926).

Horng proposes, as a method of forming a MTJ tunnel barrier, a method of covering metallic Mg after oxidation, a method of combining radical oxidation and native oxidation, and a method of performing radical oxidation a plurality of number of times and then covering a metal layer (U.S. Pre-Grant Publication No. 2007/0148786). It is not effective to insert the process of covering metallic Mg to improve the magnetotransport properties. The RAs and TMR ratios obtained by the above methods are insufficient in the manufacture of STT (Spin Torque Transfer)-MRAMs, as indicated in Table 1.

TABLE 1

|  | R×A product ($\Omega\mu m^2$) | TMR (%) |
| --- | --- | --- |
| Mg 11 Å/R-Ox | 130 | 64 |
| Mg 12 Å/R-Ox/Mg 4 Å | 220 | 62 |
| Mg 12 Å/R-Ox/Mg 4 Å/N-Ox | 460 | 60 |
| Mg 12 Å/R-Ox/Mg 3 Å/R-Ox/Mg 3 Å | 1250 | 68 |

"R-Ox" indicates radical oxidation, and "N-Ox" indicates native oxidation.

Sun also proposes insertion of a metallic aluminum layer after aluminum oxidation is performed to form an $AlO_x$ tunnel barrier of a MTJ and insists that insertion of the metallic aluminum layer is effective to reduce the R×A product and uniform the electrical characteristics for the applied voltage (U.S. Pat. No. 6,710,987). In a MTJ having an $AlO_x$ tunnel barrier formed by covering 3-Å metallic Al upon oxidation of 10-Å Al, the R×A product is effectively reduced, but the TMR ratio is reduced into half from 16% to 8%.

An arrangement of forming an oxygen surfactant layer on an underlying ferromagnetic layer before forming the $AlO_x$ tunnel barrier of a MTJ is proposed (U.S. Pat. No. 6,974,708). This prior art insists that the oxygen surfactant layer can uniform the $AlO_x$ layer. However, in the evaluation using this process for a MTJ having an MgO tunnel barrier, the oxygen surfactant layer directly formed on the underlying ferromagnetic layer greatly reduces the TMR ratio. This indicates that the thin surface oxide of the underlying ferromagnetic layer at the interface with the tunnel barrier greatly reduces the TMR ratio due to the above-mentioned spin scattering.

Solution to Problem

The problem of the present invention is directed to a method of manufacturing a magnetic tunnel junction device which achieves control of a uniform thickness of a tunnel barrier and uniformity of the stoichiometric composition and can achieve a high TMR ratio and small R×A product, and a method of manufacturing the same.

The above problem can be achieved by a method proposed by the present invention, that is, modification of a fine structure of an unoxidized metal layer by using an oxygen surfactant layer and insertion of a very thin metal layer before the oxygen surfactant layer is formed to prevent surface oxidation of the underlying ferromagnetic layer.

The present inventor found the method of the present invention based on the following findings.

In order to form a monomolecular layer of an oxide on a metal interface, two reaction materials (metal and oxygen) are separated, and the separation increases along with a progress of oxidation. This indicates that continuation of the oxidation requires movement of one or both of the reaction materials.

Mott and Carbrera propose based on a metal oxidation theory that the mobility of ions at room temperature tends to decrease due to an electric field formed by an oxide (Mott, Trans. Faraday Soc., 35 (1939), p 1175 and Cabrera, Phil. Magaz., 40 (1949), p 175).

According to this model, as shown in (a) of FIG. 3, electrons are tunneled through a thin oxide layer initially formed on a metal surface, and oxygen atoms chemically adsorbed on the surface of the oxide are ionized. This forms a uniform electric field across the oxide. This uniform electric field results in a shift in Fermi energy level, as shown in (b) of FIG. 3.

Mott and Carbrera anticipate that the metal ions becomes a mobile species in the oxide to hop the defects at the metal/oxide interface or oxide/metal interface, thereby allowing the metal ions to pass through the oxide.

[Mathematical 1]

$$\nu \exp\left(\frac{-W}{k_B T}\right) \quad (1)$$

$$\nu \exp\left(\frac{-(W - qaE)}{k_B T}\right) \quad (2)$$

Expression (1) indicates the hopping probability of metal ions when no electric field is formed. In expression (1), ν is the vibration frequency, W is the activation energy required to hop from a metal to an oxide, $k_B$ is the Boltzmann constant, and T is a temperature. A hopping probability of the metal ions upon forming an electric field across the oxide is given by expression (2). In expression (2), q is the electron charge, and a is the hopping distance, as shown in FIG. 4.

According to the teaching of Mott and Carbrera, the hopping probability of the ions greatly increases by driving of the electric field formed across the oxide. This allows the first oxidation of the metal at a low temperature. The Mott and Carbrera model assumes the mobile species as metal ions induced from the metal/oxide interface. However, recently, this mechanism is clarified that oxygen ions are transported by migration of oxide lattice defects in accordance with oxygen profiling in the direction of depth of the oxide (Starodub et al., Surf. Scie. (2004) p 199).

The Mott and Carbrera model assumes uniform and flat metal and oxide layers. However, a thin metal film actually deposited by PVD (Physical Vapor Deposition) is made of crystal particles on the nanometer order having a surface morphology associated with the crystal grain structure.

[Mathematical 2]

$$\Phi(eV) = \Phi_\infty + \Delta\Phi \quad (3)$$

The crystal grain structure modifies the work function of the metal surface into equation (3). In equation (3), $\Phi_\infty$ is the work function of a homogenous metal, and $\Delta\Phi$ is a change in work function by the morphology associated with the crystal grain structure.

[Mathematical 3]

$$\Delta\Phi = \frac{3}{8} \frac{e^2}{\varepsilon_0 \varepsilon_r R} \quad (4)$$

where R is the radius of the crystal grain, $\varepsilon_o$ is the vacuum permittivity, and $\varepsilon_r$ is the relative permittivity (Wood, Phys. Rev. Lett., 46 (1981), p 749).

The work function controls the driving electric field generated across the oxide. This makes it possible to modify the oxidation rate exponentially. When the crystal grain size of the metal layer is small and its surface becomes smooth, the work function increases, and the equilibrium of the electric field in the oxide and the potential difference decrease. Consequently, the oxidation rate greatly decreases.

In order to solve the problem posed to achieve control of the uniform thickness of the tunnel barrier of the MTJ and uniformity of the stoichiometric composition, the fine structure of the metal layer must be modified to perform oxidation while suppressing the oxidation rate.

The object of the present invention can be achieved by forming an oxygen surfactant layer and forming a metal layer on the oxygen surfactant layer. Formation of the oxygen surfactant layer makes it possible to modify the fine metal structure, that is, form a metal layer having a smaller, uniform crystal grain or amorphous structure. As described above, when the metal layer is oxidized by radial oxidation or the like, the driving electric field generated across the oxide can be reduced by the improvement of the crystal grain structure. This makes it possible to greatly reduce the oxidation rate, thereby preventing surface oxidation of the underlying ferromagnetic reference layer.

The metal layer is inserted between the underlying ferromagnetic layer and the oxygen surfactant layer. This can prevent or minimize surface oxidation of the underlying ferromagnetic reference layer at the time of forming the oxygen surfactant layer.

Advantageous Effects of Invention

The present invention can form a MTJ device tunnel barrier controlled to have a uniform thickness and having the chemical uniformity including the stoichiometric composition between the ferromagnetic reference layer and the free layer.

The surface oxidation of the underlying ferromagnetic reference layer, which occurs during formation of a tunnel barrier, can be prevented or minimized.

This makes it possible to provide a MTJ device having a large R×A product and a high TMR ratio. In addition, there is also provided a MTJ device suitable for mass production, excellent in quality of manufactured products, and excellent in in-plane uniformity.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 5A shows schematic views of a deposition sequence of a MTJ having an MgO tunnel barrier prepared by a method of the present invention, in which FIG. 5A-a shows deposition on a CoFeB reference layer, FIG. 5A-b shows deposition of a first metallic Mg layer, FIG. 5A-c shows formation of an oxygen surfactant layer (OSL: Oxygen Surfactant Layer), FIG. 5A-d shows deposition of a second metallic Mg layer, FIG. 5A-e shows oxidation, FIG. 5A-f shows deposition of a third metallic Mg cap layer, and FIG. 5A-g shows deposition of the rest of the MTJ stack;

FIG. 5B shows schematic views of the deposition sequence of the MTJ having the MgO tunnel barrier prepared by the method of the present invention, in which FIG. 5B-h shows deposition on a CoFeB reference layer, FIG. 5B-i shows deposition of a first metallic Mg layer, FIG. 5B-j shows formation of a first oxygen surfactant layer (OSL: Oxygen Surfactant Layer), FIG. 5B-k shows deposition of a second metallic Mg layer, FIG. 5B-l shows formation of a second oxygen surfactant layer (OSL: Oxygen Surfactant Layer), FIG. 5B-m shows deposition of a third metallic Mg layer, FIG. 5B-n shows oxidation, FIG. 5B-o shows deposition of a metallic Mg cap layer, and FIG. 5B-p shows deposition of the rest of the MTJ stack;

FIG. 6 shows the comparison of the numbers of particles generated by different sputtering processes;

FIG. 8B is a graph showing the comparison between the magnetotransport properties of MTJs obtained by forming MgO tunnel barriers by various methods, exhibiting the relationship between the R X A products and TMR ratios;

DESCRIPTION OF EMBODIMENTS

Embodiments of the present invention will be described in detail below. The constituent elements described in the embodiments are merely examples. The technical scope of the present invention is defined by only the scope of appended claims, but is not limited by the individual embodiments to be described below.

First Embodiment

Figure 1:
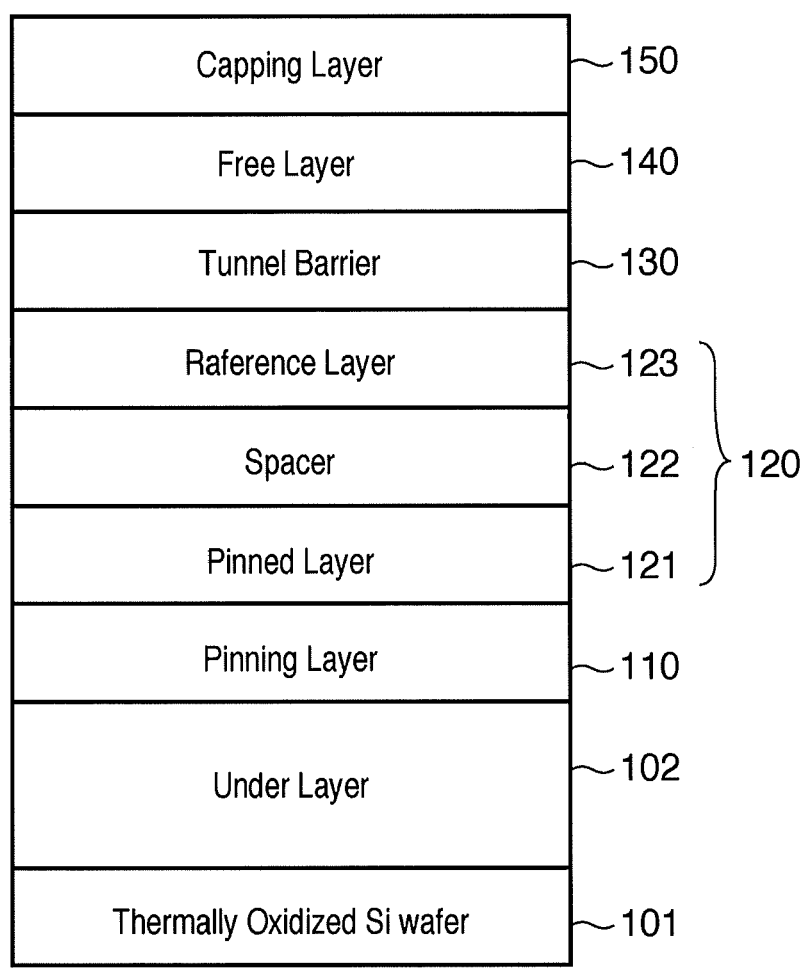
FIG. 1 is a schematic view of a magnetic tunnel junction.
Figure 2:
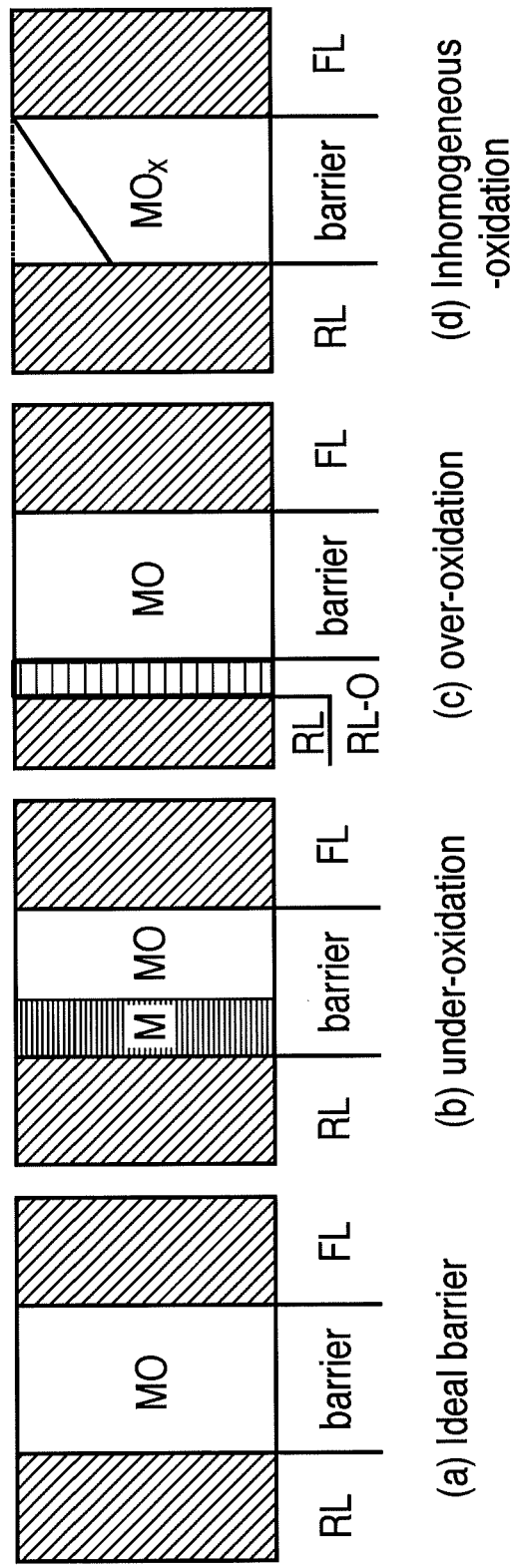
FIG. 2 shows schematic views of various oxidation states of oxidized tunnel barriers after metal deposition, in which (a) shows an ideal barrier, (b) shows under-oxidation, (c) shows over-oxidation, and (d) shows asymmetric oxidation.
Figure 3:
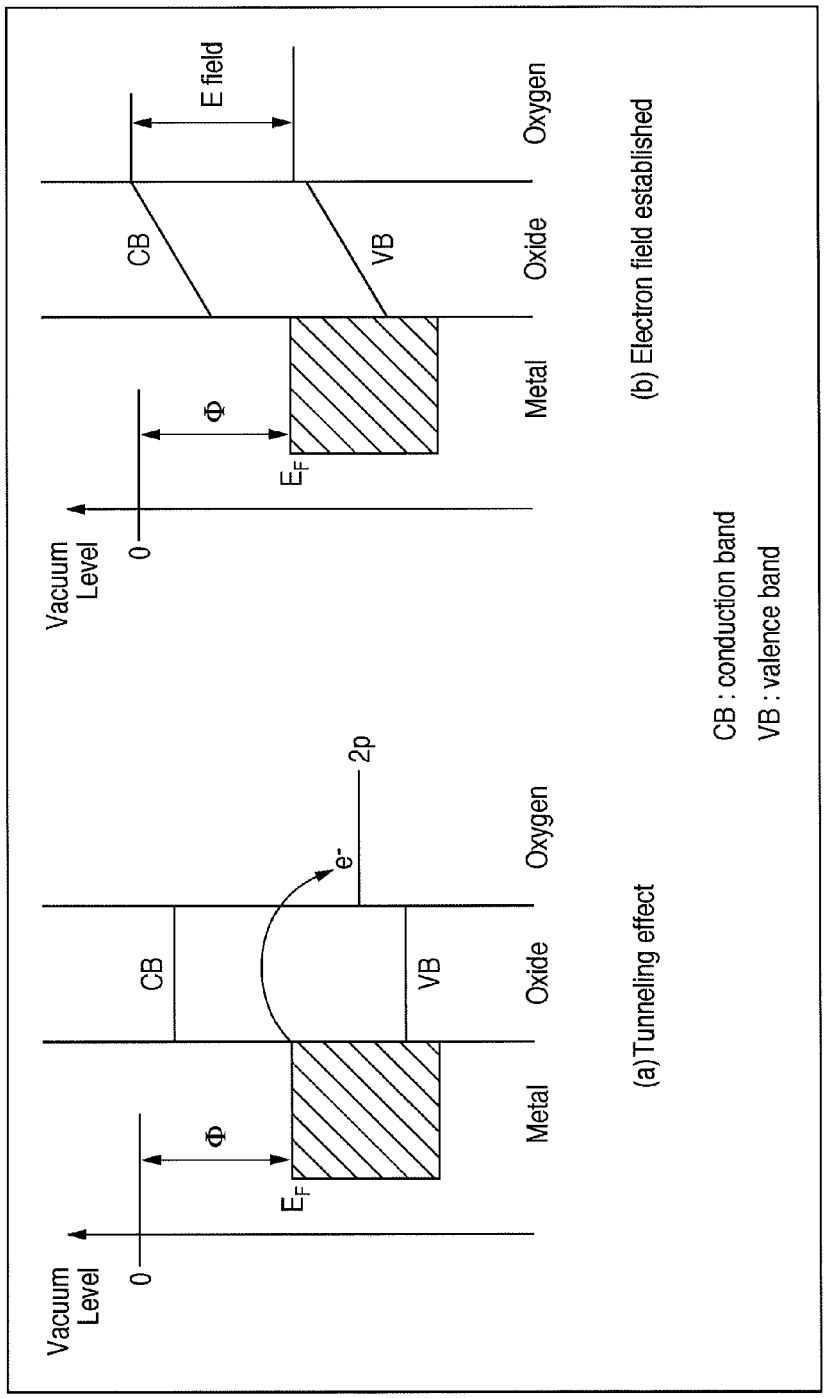
FIG. 3 shows schematic views of electric field buildup across an oxide layer, in which (a) shows an initial state in which the O $2_p$ level is lower than $E_F$ of the metal, and (b) shows energy levels in equilibrium and the electric field established across the oxide.
Figure 4:
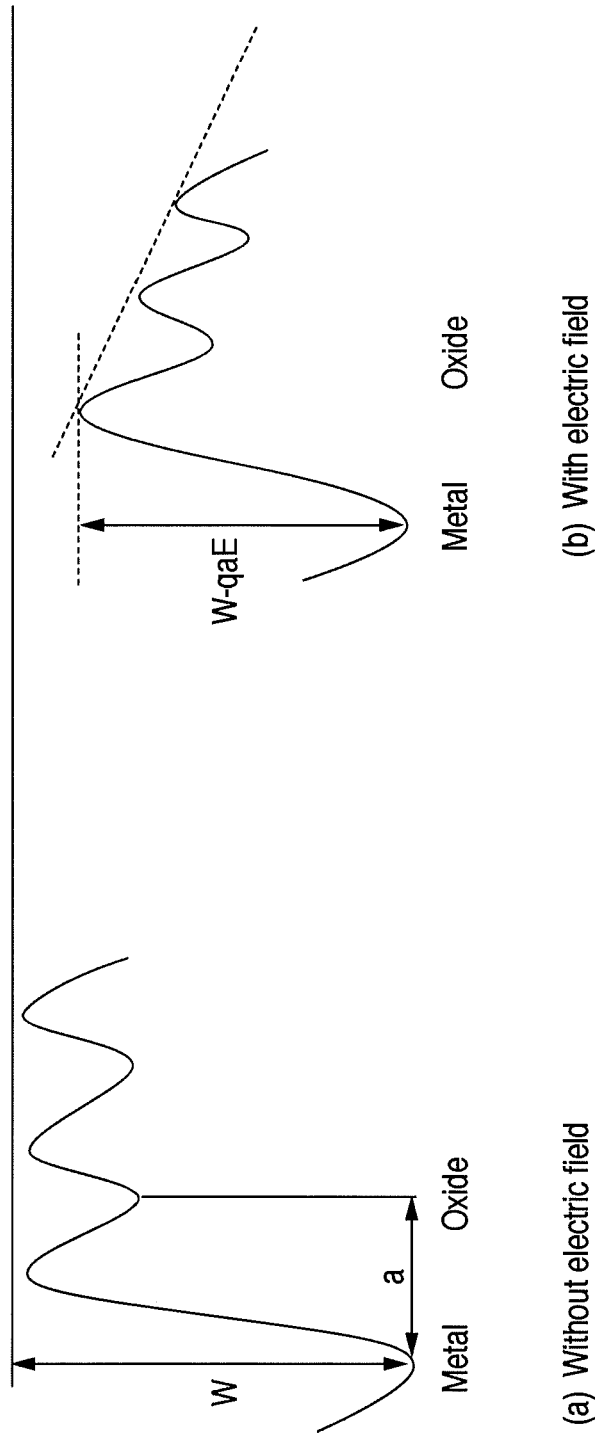
FIG. 4 shows schematic views of activation energy required for the metal ion to make the first hop, in which (a) shows a state without the energy field across the oxide, and (b) shows that with the electric field across the oxide.

FIG. 1 shows a typical deposition structure of a tunnel resistance (TMR) sensor or memory element. A general MTJ includes a ferromagnetic pinning layer 110, synthetic antiferromagnetic pinned layer 120, tunnel barrier 130, and ferromagnetic free layer 140. In the deposition structure shown in FIG. 1, the synthetic antiferromagnetic pinned layer 120 includes a ferromagnetic pinned layer 121, nonmagnetic spacer 122, and ferromagnetic reference layer 123.

Figure 9:
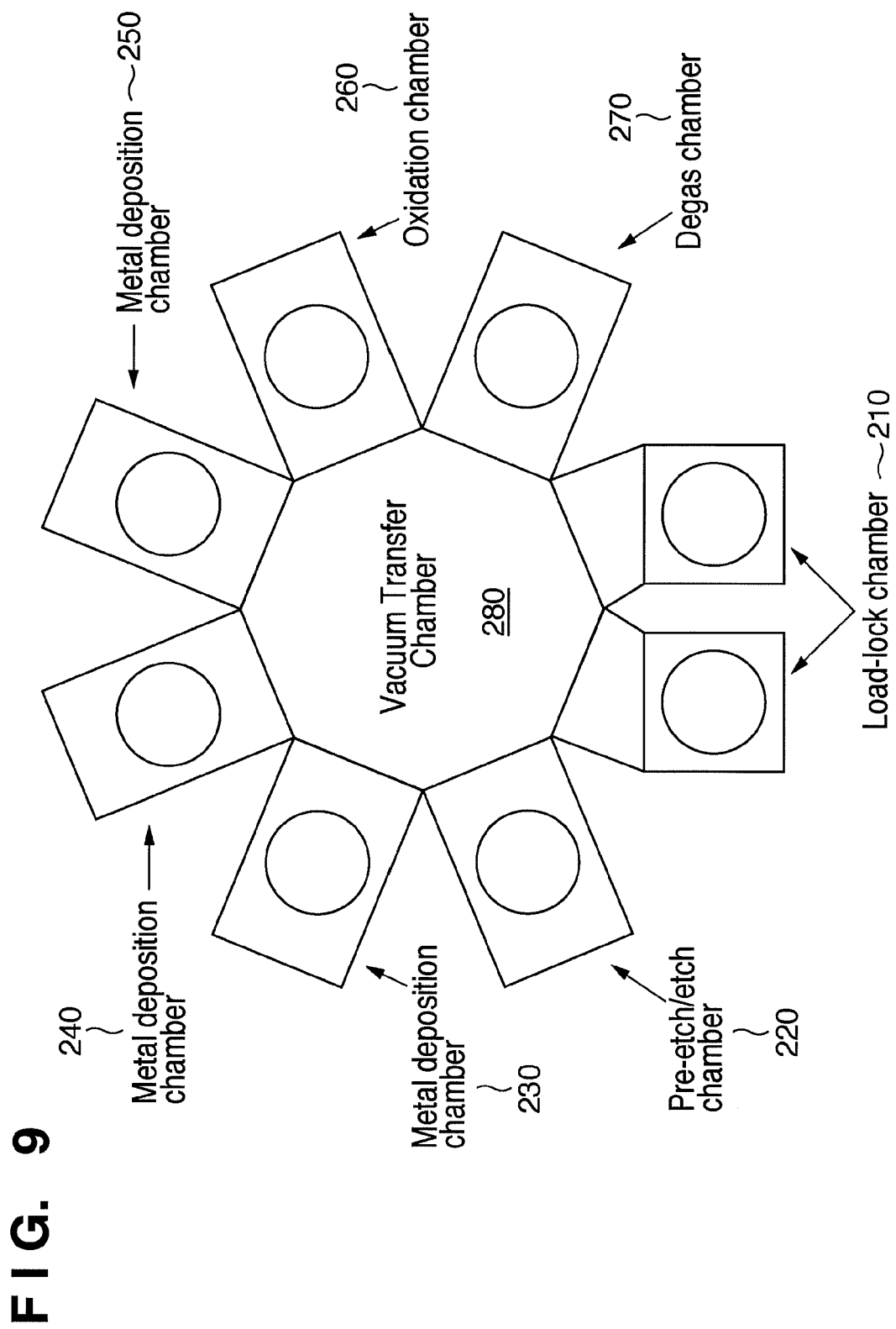
FIG. 9 exemplifies a MTJ manufacturing apparatus.

FIG. 9 exemplifies a MTJ device manufacturing apparatus and is a schematic plan view of a vacuum processing system for processing a magnetic tunnel junction device.

The vacuum processing system comprises a cluster type system having a plurality of deposition chambers 230, 240, and 250 capable of depositing thin films using the physical vapor deposition method. The plurality of deposition chambers 230, 240, and 250 are connected to a vacuum transport chamber 280 having robot loaders (not shown) at its center. Two load lock chambers 210 for loading or unloading substrates are connected to the vacuum transport chamber 280. The load lock chamber 210 can supply substrates to the robot feeders and receive the substrates transported by the robot feeders.

The vacuum processing system also comprises a degas chamber 270 and a pre-etch/etch chamber 220. The vacuum processing system further comprises an oxidation chamber 260. The chambers of the vacuum processing system are connected through gate valves for opening/closing the passages between the chambers.

Each chamber of the vacuum processing system comprises a pumping system, gas introduction system, and power supply system. The gas introduction system comprises a flow-regulating unit such as a mass flow controller. The pumping system comprises a conductance regulating means for regulating the conductance of a valve arranged between the pump and each chamber. Although not shown, each chamber comprises a pressure gauge for measuring the internal pressure of each chamber. Each chamber can be controlled to a predetermined pressure for a predetermined period of time in accordance with the operations of the flow-regulating unit and the conductance regulating means based on the output result of the pressure gauge.

Each of the deposition chambers 230, 240, and 250 of the vacuum processing system deposits a magnetic layer and nonmagnetic metal layer on a substrate one by one using the sputtering method. Each deposition chamber contains, for example, a target containing CoFe, a target containing Ru, a target containing CoFeB, or target containing Mg. A target of an antiferromagnetic material, seed material, or capping material is contained in at least one deposition chamber.

Targets of upper and lower electrode materials are placed in at least one deposition chamber. Pre-etching and etching are performed in the pre-etch/etch chamber 220. Oxidation is performed in the oxidation chamber 260. Upon forming the Mg layer, the oxygen surfactant layer (OSL) is preferentially formed in the same chamber where the Mg layer is deposited in order to prevent contamination resulting from the transportation for forming the oxygen surfactant layer.

The chamber for depositing a metal to form a tunnel barrier is connected, through a valve (not shown), to a deposition inert gas source and an oxygen gas source for forming the oxygen surfactant layer (OSL). By switching the valve, the inert gas or oxygen gas is supplied to the chamber. The deposition chamber comprises a sputtering device capable of performing DC-sputtering. The system controller (not shown) controls procedures such as gas introduction to each chamber, valve switching, ON/OFF of power supply, evacuation, substrate transportation.

According to the first embodiment, the MTJ device tunnel barrier is formed by inserting a very thin metallic Mg layer, forming an oxygen surfactant layer, performing radical oxidation, and depositing a metallic Mg cap layer.

Figure 5A:
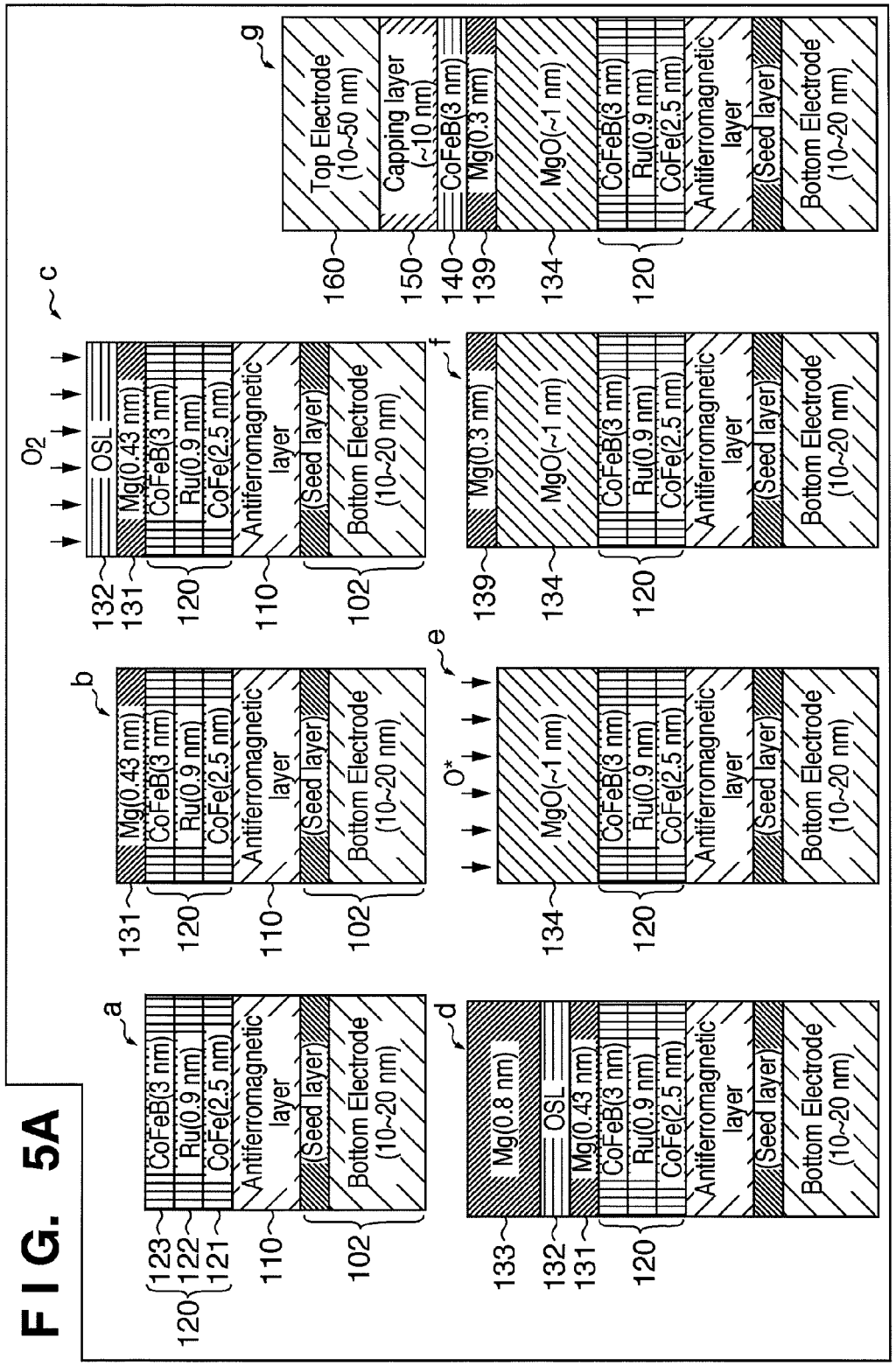

Referring to FIG. 5A, in the first embodiment, the MgO tunnel barrier 130 is formed as follows. A first metallic Mg layer 131 is formed on a CoFeB ferromagnetic reference layer 123 to a two-atomic layer thickness (0.43 nm). The resultant structure is placed under the oxygen exposure condition of $1.17 \times 10^{-2}$ Pa·sec (90 Langmuir) to form an oxygen surfactant layer 132 on the first metallic Mg layer 131. A 0.8-nm thick second metallic Mg layer 133 is deposited on the oxygen surfactant layer 132. The first and second Mg metal layers 131 and 133 are oxidized to form the MgO tunnel barrier 130. A 0.3-nm thick metallic Mg cap layer 139 is formed on the MgO tunnel barrier 130.

In the above embodiment, a method of forming the metallic Mg layers 131, 133, and 139 is not limited to a specific one, but DC-sputtering is preferable. Care must be taken for generation of particles in mass production of MRAMs. This readily occurs when MgO tunnel barriers are formed by RF-sputtering using an MgO oxide target. As shown in FIG. 6, the number of particles generated by RF-sputtering is obviously different from that generated by DC-sputtering. The numbers of mechanical particles generated during transport of substrates between the deposition chambers are compared with each other. The number of particles having a size larger than 0.16 μm in RF-sputtering using an MgO oxide target is a larger by one order of magnitude than that in DC-sputtering using a metallic Mg target. The numbers of particles were obtained by measuring them on 200-mm substrates using a KLA Tencor SPI system. The process for depositing metallic Mg layers using DC-sputtering is a particle free process.

Figure 7:
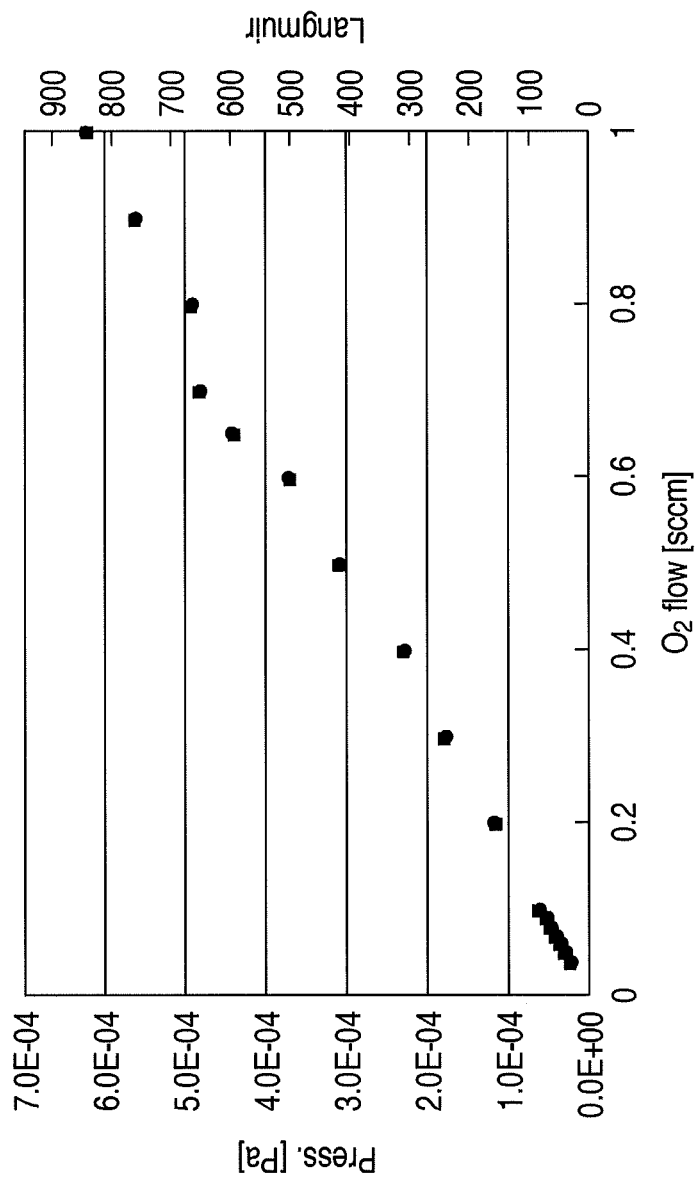
FIG. 7 shows the relationship between the oxygen flow rate and the pressure in a vacuum chamber for forming an oxygen surfactant layer, in which the right axis represents the oxygen flow rate for 180 seconds in Langmuir.

The oxygen surfactant layer 132 of the first embodiment is formed by exposing the 0.43-nm thick metallic Mg layer 131 to the oxygen atmosphere whose oxygen flow rate in the vacuum chamber is controlled. FIG. 7 shows the relationship between the oxygen flow and the pressure and the oxygen exposure for an oxygen exposure time of 180 seconds in Langmuir (1 Langmuir=$1 \times 10^{-6}$ Torr·sec). Based on this relationship, the 0.43-nm thick metallic Mg layer 131 is exposed to a predetermined oxygen atmosphere to form the oxygen surfactant layer 132.

The radical oxidation of the first embodiment is performed in the oxidation chamber 260 comprising a shower plate electrically grounded between the upper ionizing electrode and the substrate. An oxygen plasma is generated by supplying a 300-W RF power to the upper ionizing electrode at an oxygen flow rate of 700 sccm. Since the shower plate is electrically grounded, charged particles such as ions or electrons cannot pass through the shower plate, but oxygen radicals can pass through the shower plate and irradiate the substrate.

Upon completion of radical oxidation, as described above, the metallic Mg cap layer 139 is formed. As shown in FIG. 5A-g, the CoFeB ferromagnetic free layer 140, a capping layer 150, and an upper electrode layer 160 are then deposited on the metallic Mg cap layer 139. The resultant structure undergoes magnetic annealing at 3 KOe and 180° C. for 2 hrs and then at 3 KOe and 360° C. for 2 hrs. In this two-step annealing, crystallization of the MgO tunnel barrier 130 progresses in lower-temperature annealing. In higher-temperature annealing, the CoFeB ferromagnetic free layer 140 is crystallized using the crystal of the MgO tunnel barrier 130 as a crystallization template. This makes it possible to form a good crystal structure to achieve a high TMR ratio.

The magnetotransport properties of the MTJ having the MgO tunnel barrier were measured using CIPT (Current In-Plane Tunneling) in order to confirm the effect of the present invention. To examine differences of effects resulting from the different methods of manufacturing MgO tunnel barriers, identical stacks except the MgO tunnel barriers were used. Table 2 shows the different methods of manufacturing MgO tunnel barriers.

TABLE 2

| | Mg Layer 131 (nm) | OSL Layer 132 (Pa·sec) | Mg Layer 133 (nm) | R-Ox (Watt) | Mg Cap Layer 139 (nm) |
|---|---|---|---|---|---|
| Example 1 | 0.43 | 1.17 × 10⁻² | 0.8 | 300 | 0.3 |
| Comparative Example 1 | 0 | 0 | 1.2 | 300 | 0 |
| Comparative Example 2 | 0 | 0 | 1.0 | 300 | 0.3 |
| Comparative Example 3 | 0 | 0 | 1.2 | 800 | 0 |

In Table 2, R-Ox indicates radical oxidation, and numerical values indicate the magnitudes (W) of plasma formation powers in radical oxidation. The conditions of an example and comparative examples will be described in detail below. In Example 1, after an Mg layer 131 was formed, an OSL layer was formed under an oxygen exposure condition of 90 Langmuir, and an Mg layer 133 was formed. Radical oxidation was performed at 300 W to form an Mg cap layer 139. On the other hand, in Comparative Example 1, an Mg layer 133 was formed without forming an OSL layer 132. Radical oxidation was performed at 300 W, and no Mg cap layer 139 was formed. In Comparative Example 2, after an Mg layer 133 was formed, radical oxidation was performed at 300 W, and an Mg cap layer 139 was formed. In Comparative Example 3, after an Mg layer 133 was formed, radical oxidation was performed at 800 W. No Mg cap layer 139 was formed.

Figure 8A:
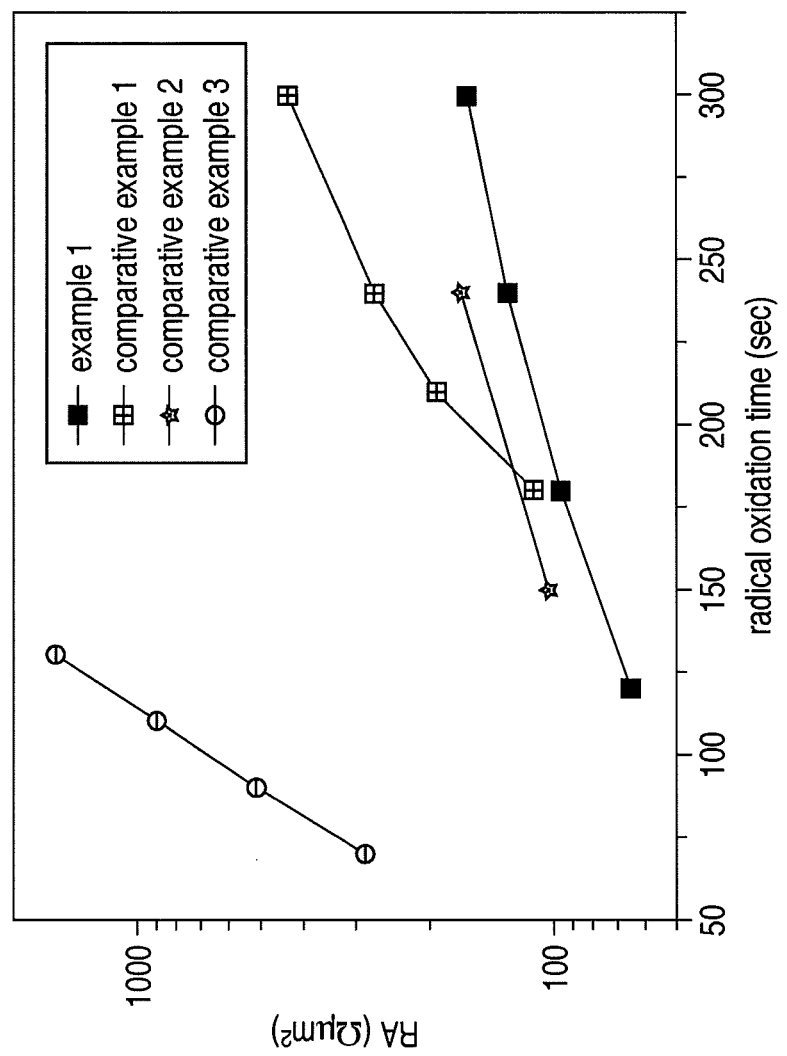
FIG. 8A is a graph showing the comparison between the magnetotransport properties of MTJs obtained by forming MgO tunnel barriers by various methods, exhibiting the relationship between the radical oxidation times and the R×A products.

As a result, as shown in FIG. 8A, an increase in R×A product upon an increase in radical oxidation time was confirmed to greatly depend on the method of forming the MgO tunnel barrier. The MgO tunnel barrier formed by the first embodiment had a low rate of increase in R×A product, and the oxidation rate was low. It was found that the surface oxidation of the underlying ferromagnetic reference layer was prevented or minimized.

As shown in FIG. 8B, the method of forming the MgO tunnel barrier of the MTJ of the first embodiment obviously achieved a high TMR ratio of 230% and a small R×A product of 65 $\Omega\mu m^2$. As compared with others, a high TMR ratio and a large R×A product can obviously be obtained. This indicates that the above values satisfy the values given to the MTJ devices for STT-MRAMs having MgO tunnel barriers formed by the method of the present invention.

Figure 10:
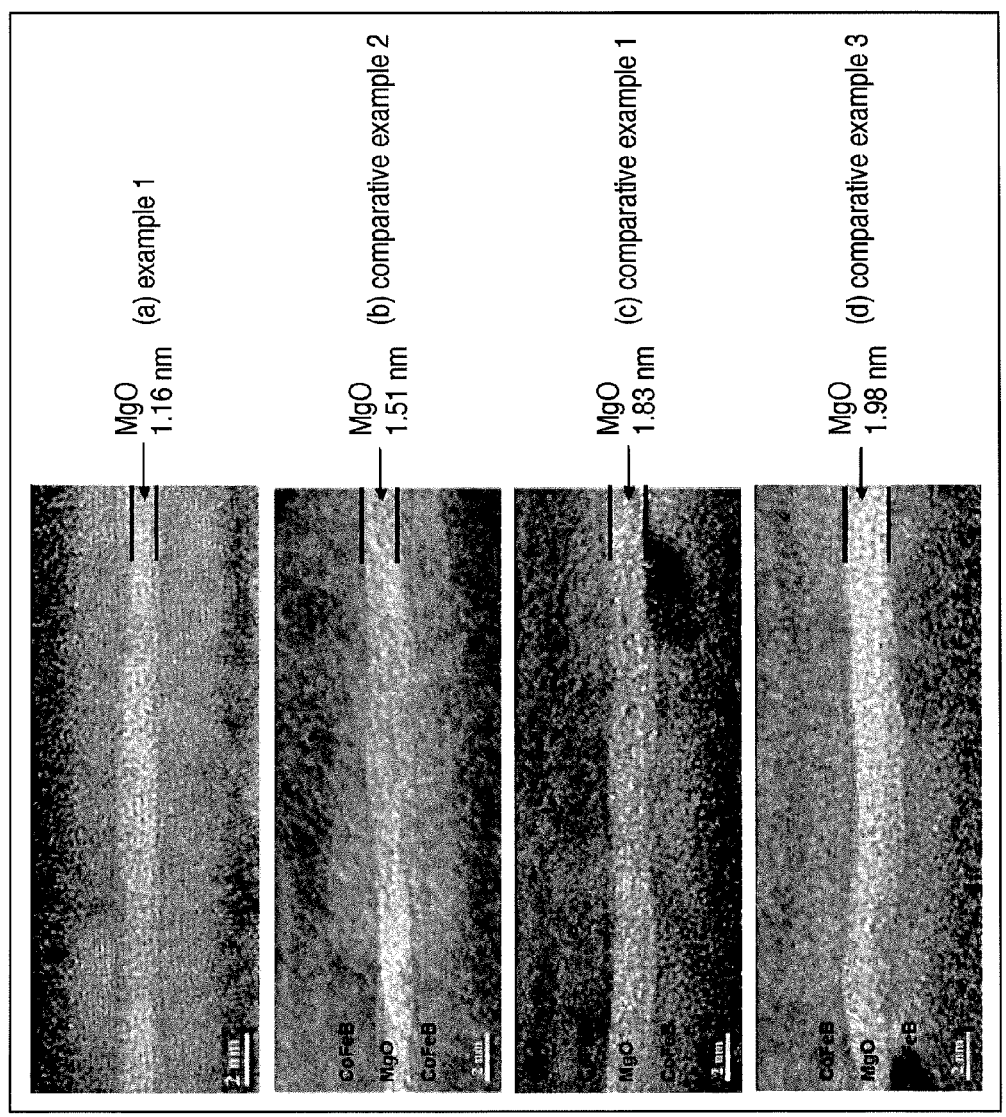
FIG. 10 shows the comparison between the thicknesses of MgO tunnel barriers whose images are obtained by high-resolution electron microscope, in which (a) shows Mg/OSL/Mg/R-Ox (300 W)/Mg, (b) shows Mg/R-Ox (300 W)/Mg, (c) shows Mg/R-Ox (300 W), and (d) shows Mg/R-Ox (800 W)/Mg.

The structures of the MTJs manufactured by the method of the first embodiment and the conventional methods shown in Table 2 were analyzed by HRTEM (High Resolution Transmission Electron Microscopy). As a result, as shown in FIG. 10, the thickness of the MgO tunnel barrier of the MTJ manufactured by the method of the first embodiment was 1.16 nm (Example 1), and it was confirmed that the MgO tunnel barrier, the ferromagnetic reference layer, and the free layer were highly crystallized.

The thicknesses of the MgO tunnel barriers of the MTJs manufactured by the conventional methods were much larger than 1.16 nm. The thickness of MgO of Comparative Example 2 is 1.51 nm. In particular, the MgO tunnel barriers and ferromagnetic reference layers formed in Comparative Example 1 (the thickness of MgO is 1.83 nm) without the Mg cap layer 139 at an RF power of 300 W in radical oxidation and Comparative Example 3 (the thickness of MgO is 1.98 nm) without the Mg cap layer 139 at an RF power of 800 W in radical oxidation were extremely low in crystallinity. This is because the MgO tunnel barrier was excessively oxidized and the ferromagnetic CoFeB reference layer interface was oxidized during radical oxidation. The structure of the interface oxide layer prevents template action of the MgO tunnel barrier in crystallization of amorphous CoFeB during magnetic field annealing. Differences in thicknesses of MgO tunnel barriers and crystallinity after magnetic field annealing result in large differences in R×A product and TMR ratios of the MTJs.

As described with reference to the first embodiment, using the MgO structure and further control of the process of the first embodiment, it is expected to obtain a MTJ for the STT-MRAM product having an MgO tunnel barrier whose TMR ratio exceeds 160% and R×A product is less than 50 $\Omega\mu m^2$ and a MTJ for a read head product whose R×A product is less than 2 $\Omega\mu m^2$ and a TMR ratio exceeds 30%. The MTJ having the MgO tunnel barrier formed by the first embodiment is suitable for the high-density/high-performance spintronic applications.

The first embodiment is merely an example, and the present invention is not limited to it. For example, the multilayered structure of an element having a MTJ is not limited to the one shown in FIG. 1.

Oxidation is not limited to radical oxidation, but can be plasma oxidation, ozone oxidation, and native oxidation.

The first and second metal layers for forming a tunnel barrier include at least one element selected from Al, Cr, Ni, Ta, Ti, Hf, Si, Zr, and Ga. Similarly, the material of the cap layer is not limited to the one containing only Mg. The cap layer may be a layer further containing at least one element selected from, for example, Al, Cr, Ni, Ta, Ti, Hf, Si, Zr, and Ga.

The material of the ferromagnetic free layer is not limited to CoFeB. A material containing CoFe, Fe, and NiFe as major components and other additives can be used as the material of the ferromagnetic free layer. In addition, a material containing Co, Fe, and B in a mixing ratio other than 1:1:1 can be used as the material of the ferromagnetic free layer. A material containing different elements may also be used as the material of the ferromagnetic free layer.

The ferromagnetic free layer is not limited to a single layer, but can be two or more ferromagnetic layers having different coercive forces. Alternatively, a nonmagnetic spacer may be interposed between the ferromagnetic layers having difference coercive forces.

An example of this ferromagnetic free layer is a layer containing CoFeB at the interface with the tunnel barrier. This layer contains NiFe on the side of CoFeB layer opposite to the tunnel barrier.

An example of the structure including the nonmagnetic spacer is a layer containing CoFeB at the interface with the tunnel barrier. This layer sequentially includes an Ru layer and an NiFe layer at an interface opposite to CoFeB.

In the first embodiment, the ferromagnetic reference layer is formed closer to the substrate than the ferromagnetic free layer. However, the ferromagnetic free layer may be formed closer to the substrate.

A layer having an amorphous interface with the tunnel barrier is crystallized during magnetic field annealing using the tunnel barrier as the crystallization template. This makes it possible to provide a high TMR ratio.

A ferromagnetic layer may be formed not by DC-sputtering but by RF-sputtering. In addition, the ferromagnetic layer need not be formed by sputtering, but by epitaxial growth. However, use of the sputtering method can reduce the cost and shortens the manufacturing time.

The amount of oxygen exposure in formation of the oxygen surfactant layer is different from that in oxidation for oxidizing the entire metal layer. The unit of the amount of oxygen exposure is Langmuir. The amount of oxygen exposure required to entirely oxidize a 30-Å Al layer is $4.68 \times 10^6$ Pa·sec ($3.6 \times 10^{10}$ Langmuir) (Bae et al., Appl. Phys. Lett., 80 (2002), p 1168). The amount of oxygen exposure required to fully oxidize a 7-Å Mg layer is $3.9 \times 10^2$ Pa·sec ($3 \times 10^8$ Langmuir) (Zhao et al., U.S. Pre-Grant Publication No. 2007/0111332). The amount of oxygen exposure applied to 4.3-Å Mg to form an oxygen surfactant layer is on the order of $10^2$ Langmuir. An OSL is a layer formed by placing a metal layer made of Mg or the like in a non-plasma atmosphere of a gas (for example, oxygen gas) containing oxygen as an element. For example, an OSL can be formed in a high purity oxygen atmosphere in a vacuum vessel in which the amount of oxygen exposure is maintained at a predetermined pressure for a predetermined period of time, that is, $3.9 \times 10^{-3}$ Pa·sec (30 Langmuir) to $2.6 \times 10^{-2}$ Pa·sec (200 Langmuir).

The thickness of the first metallic Mg layer 131 is given as 0.43 nm in FIG. 5A, but is not limited to this. The average layer thickness falls within the range of one-atomic layer thickness (inclusive) to three-atomic layer thickness (inclusive). The thickness of the second metal layer 133 is not limited to 0.8 nm. The second metal layer 133 is preferably formed within the average thickness range of 5 Å (inclusive) to 15 Å (inclusive). Similarly, the thickness of the metal Mg cap layer 139 is not limited to a specific value, but preferably falls within the average thickness range of 2 Å (inclusive) to 5 Å (inclusive).

Second Embodiment

The second embodiment will exemplify a MTJ tunnel barrier forming method of forming a tunnel barrier by inserting a very thin metallic Mg layer, forming an oxygen surfactant layer, performing radical oxidation at a low RF power, and depositing a metallic Mg cap layer.

Figure 5B:
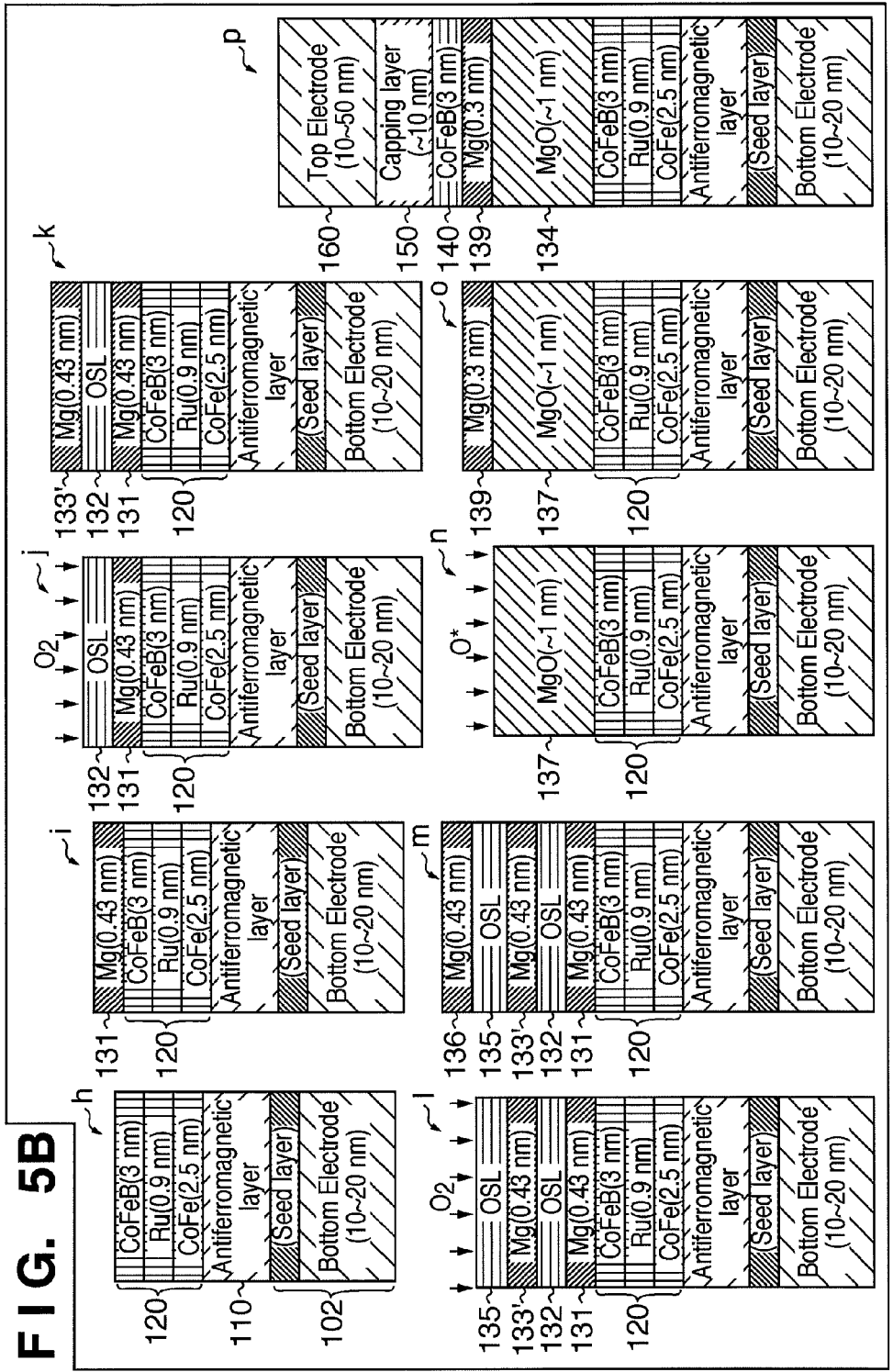

As shown in FIG. 5B, an MgO barrier according to the present invention is formed as follows. A first metallic Mg layer 131 is deposited on a CoFeB ferromagnetic reference layer 123 to a two-atomic layer thickness (0.43 nm). The first metallic Mg layer is exposed to an oxygen atmosphere of $1.17 \times 10^{-2}$ Pa·sec (90 Langmuir) to form a first oxygen surfactant layer 132. A second metallic Mg layer 133' is deposited on the first oxygen surfactant layer 132 to a two-atomic layer thickness (0.43 nm). The second metallic Mg layer 133' is exposed to an oxygen atmosphere of $1.17 \times 10^{-2}$ Pa·sec (90 Langmuir) to form a second oxygen surfactant layer 135. A third metallic Mg layer 136 is deposited on the second oxygen surfactant layer 135 to a two-atomic layer thickness (0.43 nm). The first, second, and third metallic Mg layers 131, 133', and 136 undergo radical oxidation. A 0.3-nm thick third metallic Mg cap layer 139 is deposited on the MgO tunnel barrier 137.

Each oxygen surfactant layer of the second embodiment is formed in the vacuum chamber by the corresponding 0.43-nm metallic Mg layer. The oxygen atmosphere is controlled by the oxygen flow rate obtained by the relationship shown in FIG. 7.

Radical oxidation according to the present invention is performed in an oxidation chamber in which an electrically grounded shower plate is arranged between an upper ionizing electrode and a substrate. An oxygen plasma is generated by applying a 300-W RF power to the upper ionizing electrode and introducing oxygen gas at a flow rate of 700 sccm. Charged particles such as ions and electrons cannot pass through the electrically grounded shower plate, but an oxygen radical shower can pass through the shower plate.

As shown in FIG. 5B-o, the CoFeB ferromagnetic free layer, capping layer, and upper electrode layer are formed on the metallic Mg cap layer 139.

Magnetic field annealing is performed at 3 KOe and 180° C. for 2 hrs and then 3 KOe and 360° C. for 2 hrs In this two-step annealing, crystallization of the MgO tunnel barrier 130 progresses in lower-temperature annealing. In higher-temperature annealing, the CoFeB ferromagnetic free layer 140 is crystallized using the crystal of the MgO tunnel barrier 130 as a crystallization template. This makes it possible to form a good crystal structure to achieve a high TMR ratio.

Using the MgO structure and further control of the process of the present invention, it is expected to obtain a MTJ for the STT-MRAM product having an MgO tunnel barrier whose TMR ratio exceeds 160% and R×A product is less than 50 $\Omega \mu m^2$ and a MTJ for a read head product whose R×A product is less than 2 $\Omega \mu m^2$ and a TMR ratio exceeds 30%. The MTJ having the MgO tunnel barrier formed by the first embodiment is suitable for the high-density/high-performance spintronic application.

As many apparently widely different embodiments of the present invention can be made without departing from the spirit and scope thereof, it is to be understood that the invention is not limited to the specific embodiments thereof except as defined in the appended claims.

The invention claimed is:

1. A method of manufacturing a magnetic tunnel junction device including a barrier layer forming step of forming a tunnel barrier layer, the barrier layer forming step comprising:

a step of depositing a first metal layer;

an oxygen surfactant layer forming step of placing the first metal layer in a non-plasma atmosphere of gasses containing oxygen as an element and having $3.9 \times 10^{-3}$ Pa·sec (inclusive) to $2.6\times10^{-2}$ Pa·sec (inclusive), thereby forming an oxygen surfactant layer whose oxygen is adsorbed to a surface of the first metal layer;

a step of deposing a second metal layer above the first oxygen surfactant layer; and an oxidation step of oxidizing the first metal layer and the second metal layer to form a metal oxide layer.

2. The method of manufacturing a magnetic tunnel junction device according to claim 1, wherein the barrier layer forming step further comprises a step of depositing a cap metal layer above the metal oxide layer.

3. The method of manufacturing a magnetic tunnel junction device according to claim 1, wherein the first metal layer is formed to an average thickness of one monolayer (inclusive) to three monolayers (inclusive).

4. The method of manufacturing a magnetic tunnel junction device according to claim 1, wherein the second metal layer is formed to an average thickness of 5 Å (inclusive) to 15 Å (inclusive).

5. The method of manufacturing a magnetic tunnel junction device according to claim 1, wherein the oxidation step includes radical oxidation, plasma oxidation, ozone oxidation, and native oxidation.

6. The method of manufacturing a magnetic tunnel junction device according to claim 1, wherein the metal oxide layer comprises a layer containing magnesium oxide.

7. The method of manufacturing a magnetic tunnel junction device according to claim 1, wherein one of the first metal layer and the second metal layer is formed by DC sputtering using a metal target.

8. The method of manufacturing a magnetic tunnel junction device according to claim 1, wherein the barrier layer forming step comprises forming the tunnel barrier layer on an amorphous ferromagnetic layer and includes a first annealing step of crystallizing the tunnel barrier layer and a second annealing step of crystallizing the ferromagnetic layer at a temperature higher than that of the first annealing step.

9. An apparatus for manufacturing a magnetic tunnel junction device used for a method defined in claim 1, said apparatus comprising:

a vessel;

an electrode which forms a plasma in said vessel;

gas introduction means for introducing a gas to said vessel;

evacuation means for evacuating said vessel; and a controller which controls to supply power to said gas introduction means, evacuation means, and said electrode, wherein said controller performs an operation for depositing a first metal layer by sputtering a target placed in said vessel, an operation for maintaining the vessel in an oxygen atmosphere at a predetermined pressure for a predetermined period of time and forming an oxygen surfactant layer on the first metal layer, and an operation for forming a second metal layer above the oxygen surfactant layer by sputtering.

10. The method of manufacturing a magnetic tunnel junction device according to claim 2, wherein the cap metal layer is formed to an average thickness of 2 Å (inclusive) to 5 Å (inclusive).

* * * * *